United States Patent [19]

Maxner et al.

[11] 4,425,947
[45] Jan. 17, 1984

[54] SINGLE POINT CUT AND CLENCH MECHANISM

[75] Inventors: Richard B. Maxner; Vitaly Bandura, both of Danvers, Mass.

[73] Assignee: USM Corporation, Farmington, Conn.

[21] Appl. No.: 317,749

[22] Filed: Nov. 3, 1981

[51] Int. Cl.³ .............................................. B21F 1/00
[52] U.S. Cl. ...................................... 140/105; 29/741
[58] Field of Search ................ 140/105, 930; 29/835, 29/838, 741, 566.3, 566.4

[56] References Cited

U.S. PATENT DOCUMENTS 3,062,245 11/1962 Liebscher .......................... 29/566.4
3,769,823 11/1973 Greeninger ........................ 29/566.3

Primary Examiner—Francis S. Husar
Assistant Examiner—Linda McLaughlin
Attorney, Agent, or Firm—Alan N. McCartney

[57] ABSTRACT

A mechanism for cutting and clinching a long lead of an electrical component where the cut-clinch head is displaced from its support surface a sufficient distance to accommodate a long lead, the head support being mounted for rotational movement and adapted to coact with a X-Y table carrying a substrate so that a single lead of a multiple lead component can be cut even though there is minimal clearance between the component leads. Further, after such a single lead has been cut, the head support can be repositioned to cut a second lead regardless of whether that lead is properly aligned.

4 Claims, 4 Drawing Figures

SINGLE POINT CUT AND CLENCH MECHANISM

BACKGROUND OF THE INVENTION

This invention relates to a mechanism for cutting and clinching the lead of an electrical component which has been inserted through the predetermined opening in a circuit board.

There has been provided in the prior art a number of different types of devices for cutting and clinching component leads, either where the component has been placed in a circuit board automatically or manually. These devices are designed to act on components having variable lead spacings such as illustrated in Foley U.S. Pat. No. 4,153,082. Other devices designed to cut-clinch component leads are illustrated in U.S. Pat. Nos. 3,986,533; 3,429,170; 3,852,865; 2,893,010; and 3,414,024. None of these devices however provide for sufficient clearance in the cut-clinch mechanism to cut long component leads. Further, they are not designed to cut and clinch a single lead of a multiple lead component.

SUMMARY OF THE INVENTION

It is the primary object of this invention to provide a single point cut-clinch mechanism that has the cutting and clinching mechanism sufficiently displaced from its support to accommodate a long lead of a component that extends through the circuit board.

It is a further object of this invention to provide a cut-clinch mechanism for multiple lead components, the mechanism being supported for rotational movement responsive to the lead location to cut-clinch the lead even though there may be minimal clearance between the component leads.

The mechanism is software controlled so that it can be positioned responsive to the lead location so that a single lead of a multiple lead component can be cut-clinched and then repositioned to cut-clinch an adjacent lead of that component.

To this end, a cut-clinch mechanism is supported for up and down, rotational and linear movement with respect to a substrate carried on a X-Y table so that software controls can position the cutting and clinching head with respect to a single lead of a multiple lead component, cut and clinch that lead and then be repositioned to cut-clinch another lead of that component. Thus, with this invention, a single long lead of a multiple lead component can be cut-clinched even though there is a minimal clearance or spacing between the leads.

The mechanism basically comprises a cut-clinch head having a stationary cutter and a pivotally mounted movable cutter and clincher, the movable cut-clinch portion of the head being actuated by a cam having an adjustable throw so that the spacing between the stationary and movable portions of the head can be adjusted to accommodate different lead diameters.

BRIEF DESCRIPTION OF THE DRAWINGS

The foregoing and other features of this invention will become more apparent upon reading the accompanying detailed description in reference to the drawings which illustrate.

DESCRIPTION OF THE PREFERRED EMBODIMENT

Figure 1:
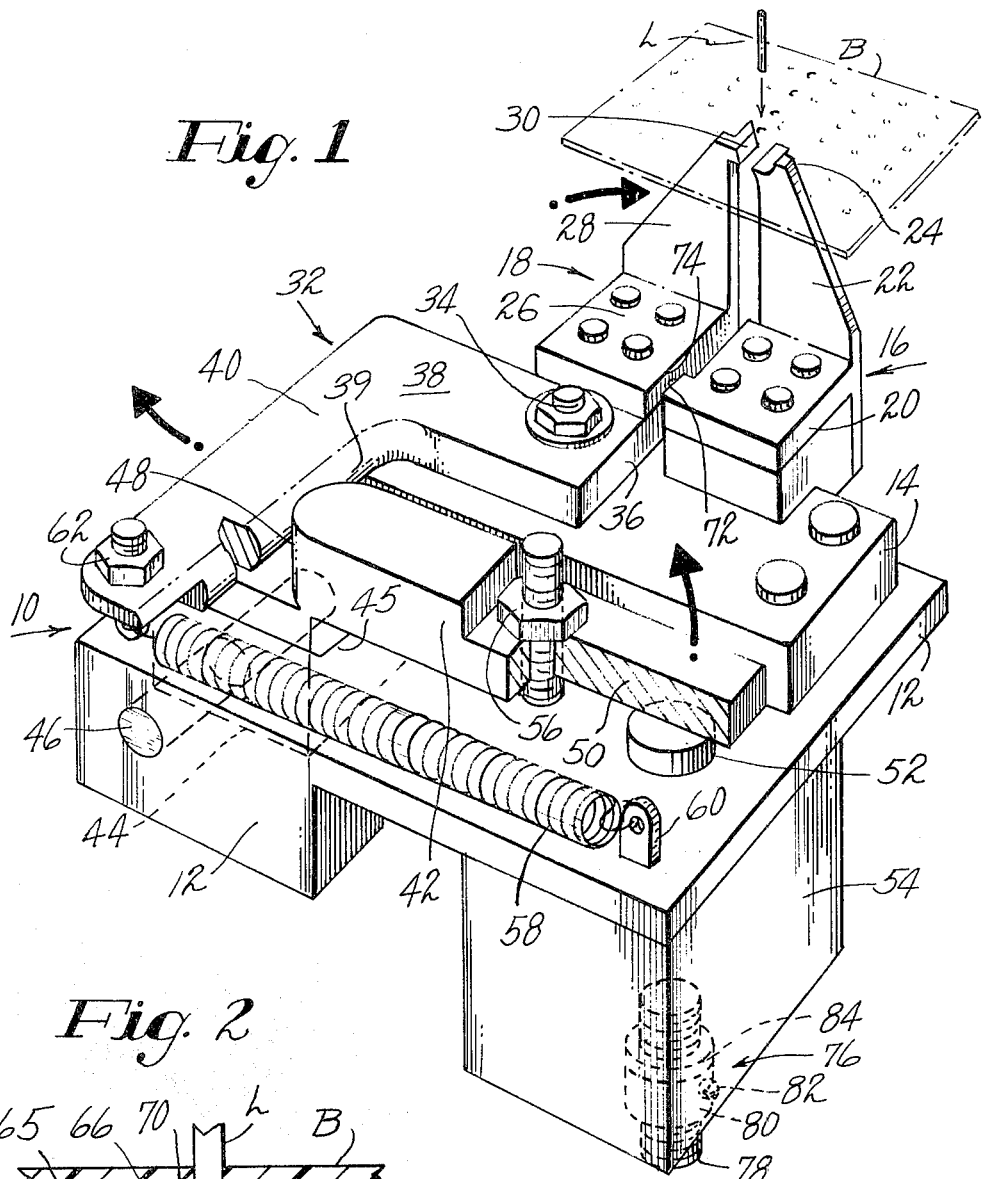
FIG. 1 is a perspective view of the cut-clinch head of this invention.

Attention is now directed to FIG. 1 which illustrates the cut-clinch head 10 of this invention. The head 10 is adapted to be carried on a housing such as housing 38 illustrated in U.S. Pat. No. 4,153,082. In this fashion, the head 10 can move linearly, rotate and move up and down with respect to the circuit board which is carried on an X-Y table. The head 10 has a fixed plate 12 which can be attached to the housing 38 by any convential means. The illustration and description of the operation of the mechanism illustrated in U.S. Pat. No. 4,153,082 is incorporated herein by reference.

The plate 12 carries a support block 14 upon which the cut-clinch members 16 and 18 are mounted. The members 16 and 18 are L-shaped and extend outwardly from the head to provide sufficient clearance so that a long component lead can extend downwardly from the circuit board without interference and be cut and clinched.

The fixed cut-clinch member 16 has a base 20 fixed to block 14 by any convential means such as screws as illustrated. The base 20 has an upwardly extending plate 22 which terminates in the fixed cut-clinch head portion 24.

The movable cut-clinch member 18 has a base 26 and upwardly extending plate 28 that terminates in the movable cut-clinch head portion 30. The base 26 of member 18 is carried on the pivot plate 32 which is pivotally mounted on support block 14 by pivot pin 34.

The pivot plate 32 is Z-shaped and has an integral leg 36 upon which base 26 is mounted by any conventional means, such as screws, as illustrated. The plate 32 also comprises the medial portion 38 through which pivot pin 34 is mounted. The leg 40 of plate 32 extends rearwardly and coacts with cam actuator 42 to close the head and cut-clinch the component lead as will become apparent hereinafter.

The actuator 42 has a nose or head portion 44 pivotally carried in opening 45 of plate 12 by pivot pin 46. The head portion 44 extends downwardly from the body of the actuator 42 into opening 45 in plate 12. As illustrated in FIG. 1, the head 44 is pivotally carried on pivot pin 46 positioned in plate 12. The upper portion of the actuator 42 has a cam 48 contacting the rounded edge 39 of leg 40. A rear portion 50 of the actuator 42 coacts with the piston 52 of cylinder 54.

Figure 3:
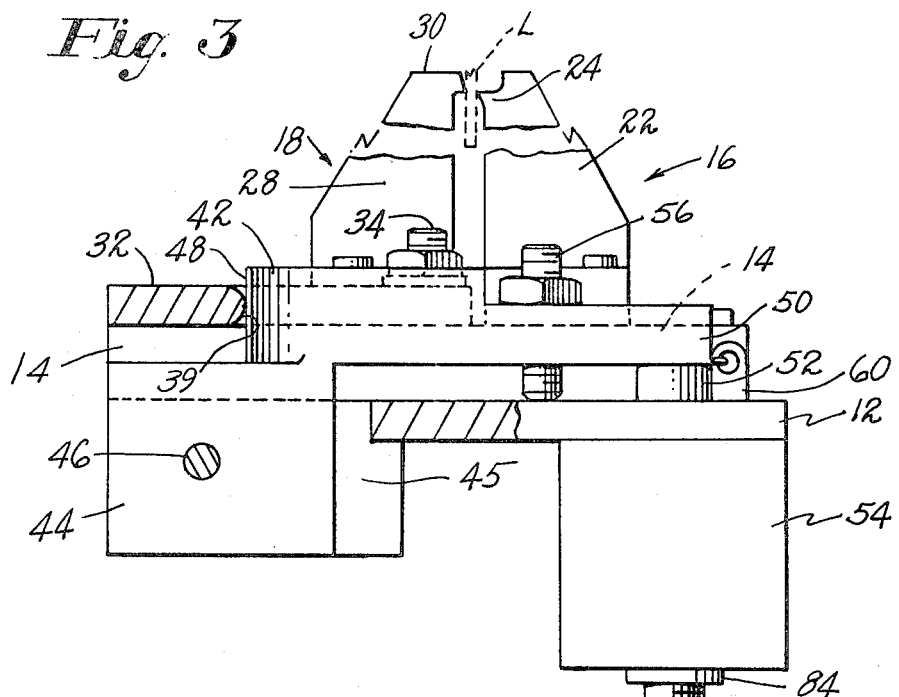
FIG. 3 is a side elevational view partially broken away illustrating the pivotal mounting of the cam actuator to the plate.
Figure 4:
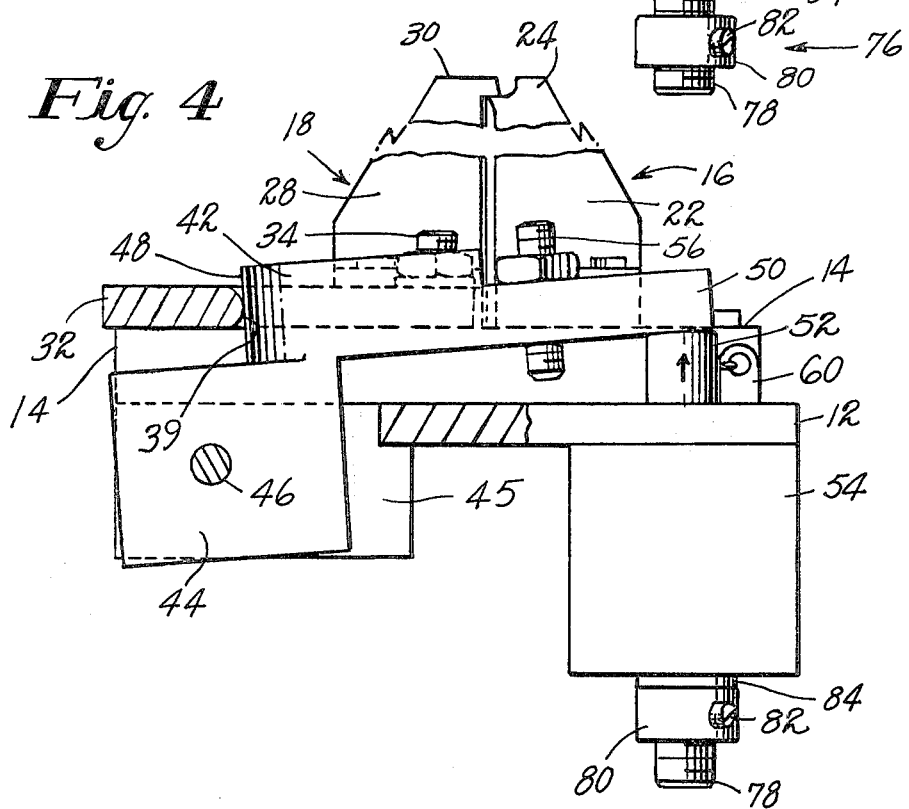
FIG. 4 is a side elevational view partially broken away illustrating the cam actuator pivoting the movable cut-clinch member to cut and clinch a component lead.

In operation, (see FIGS. 3 and 4) upon actuation of the cylinder 54, piston 52 moves rear portion 50 of the actuator 42 upwardly causing the actuator to pivot about pin 46 in the direction of the arrow shown in FIG. 1. This causes cam surface 48 to move upwardly and outwardly to the left as shown in FIG. 1 as the actuator pivots about pin 46. This permits the cam surface 48 to pivot plate 32 in the direction of the arrow shown in FIG. 1, thus closing the head portions to cut and clinch the component lead.

A return spring 58 is attached to plate 12 by pin 60 and to the rear of pivot plate 32 by pin 62. Thus, the head portion will automatically open upon release of the piston.

An adjustable stop 56 is provided in the rear portion 50 of the actuator to adjust the return position of the cam and thus the spacing between the cut-clinch head members. The stop can be threaded into or out of the rear portion 50 to raise or lower the actuator 42 about pivot pin 46, thus locating the cam on the leg 40 of pivot plate 32 to adjust the spacing between the cut-clinch members 16 and 18 to the desired lead diameter.

Figure 2:
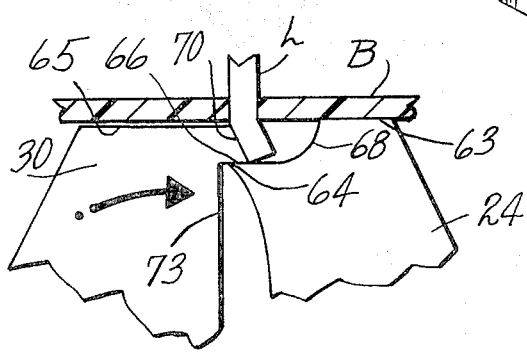
FIG. 2 is an enlarged view of the cutting and clinching portions of the head.

Attention is now directed to FIG. 2 which illustrates an enlarged view of the cut-clinch portions of the head. As illustrated, the lead (L) of the component is in place through its desired opening in the circuit board (B) by any desired component placement mechanism. The fixed head portion 24 has an upper end 63 that acts as a backing member to support the board while the lead (L) is inserted into the board (B). The upper end 65 of movable head portion 30 is spaced from the board (B) to avoid contact with the board during cutting and clinching. The fixed head portion 24 also has a cutting edge 64 coacting with the cutting edge 66 of the movable head portion 32. While the movable head portion 30 is cutting the lead, the nose portion 70 of the portion 30 bends the lead into the relieved area 68 of the portion 24 to clinch the lead to secure the lead into the board. The head portions 24 and 30 also have contact faces 72,74 that limit the movement the head portions 24 and 30 so that the cutting edge 64 cannot contact the face 73 of the movable head 30.

The throw of cam 48 and thus the amount of bending of lead (L) during clinching is controlled by an adjustment 76 on the movement of the piston 52. The adjustment 76 comprises a threaded end 78 on the piston carrying stop nut 80 which is locked into position on the end 78 by set screw 82. The threaded end 78 can also carry a bumper pad 84 to absorb movement of the piston 52. The throw of cam 48 and thus the amount of bending or clinching of lead (L) is controlled by limiting upward movement of the piston by the position of stop nut 80 on the threaded end 78 of the piston.

Thus it can be seen that the cut clinch head of this invention when used with the motion providing mechanism of the U.S. Pat. No. 4,153,082 can cut a single lead of a multiple lead component that has minimal clearance between adjacent leads.

We claim:

1. A mechanism for cutting and clinching the lead of an electrical component that has been inserted in a circuit board comprising:
   a. a base support means adapted to be fixed to means coacting with a circuit board carrier to place the mechanism in a predetermined position for the cut-clinch operation;
   b. a cutting and clinching head having movable and fixed cut-clinch portions carried on the support means;
   c. said movable portion having a cut-clinch portion on one end and a cam surface on the opposite end, said movable portion being pivotally carried on the support means intermediate its ends and pivoted to a closed head position in response to a cam actuator pivotally carried on the support means.

2. The mechanism of claim 1, wherein said movable portion is a Z-shaped plate having the cut-clinch head at one free end and a cam contacting surface at the other free end with a pivot pin located medially between the free ends.

3. The mechanism of claim 1, wherein each of the cut-clinch portions have upwardly positioned lead engaging portions displaced from the support means to leave clearance for cutting and clinching long lead components.

4. The mechanism of claim 3, wherein the movable cut-clinch lead engaging portion has a cutting edge coacting with the fixed portion and an adjacent lead bending portion that bends the cut end of the lead toward the fixed portion.

* * * * *